United States Patent
Wu et al.

(10) Patent No.: US 8,644,654 B2
(45) Date of Patent: Feb. 4, 2014

(54) OPTICAL COUPLER MODULE HAVING OPTICAL WAVEGUIDE STRUCTURE

(75) Inventors: Mao-Jen Wu, Taoyuan (TW);
Hsiao-Chin Lan, Taoyuan (TW);
Yun-Chih Lee, Taoyuan (TW);
Chia-Chi Chang, Taoyuan (TW);
Hsu-Liang Hsiao, Taoyuan (TW);
Chin-Ta Chen, Taoyuan (TW);
Bo-Kuan Shen, Taoyuan (TW);
Guan-Fu Lu, Taoyuan (TW);
Yan-Chong Chang, Taoyuan (TW);
Jen-Yu Chang, Taoyuan (TW)

(73) Assignee: National Central University, Taoyuan (TW)

( * ) Notice: Subject to any disclaimer, the term of this patent is extended or adjusted under 35 U.S.C. 154(b) by 100 days.

(21) Appl. No.: 13/114,330

(22) Filed: May 24, 2011

(65) Prior Publication Data
US 2011/0286695 A1   Nov. 24, 2011

(30) Foreign Application Priority Data

May 24, 2010  (TW) ............................... 99116550 A
May 28, 2010  (TW) ............................... 99117302 A

(51) Int. Cl.
*G02B 6/12*   (2006.01)
(52) U.S. Cl.
USPC .................................. 385/14; 385/48; 385/31
(58) Field of Classification Search
USPC .............................................. 385/14, 31, 48
See application file for complete search history.

(56) References Cited

U.S. PATENT DOCUMENTS 5,764,832 A   6/1998   Tabuchi
6,227,722 B1   5/2001   Kropp
(Continued)

FOREIGN PATENT DOCUMENTS

CN   101509989 A   8/2009
CN   101521194 A   9/2009
(Continued)

OTHER PUBLICATIONS

Jing Xue, Alok Garg, Berkehan Ciftcioglu, Jianyun Hu, Shang Wang, Ioannis Savidis, Manish Jain\, Rebecca Berman\, Peng Liu, Michael Huang, Hui Wu, Eby Friedman, Gary Wicks\, Duncan Moore\, An intra-chip free-space optical interconnect, ACM SIGARCH Computer Architecture News—ISCA '10, vol. 38, Issue 3, pp. 94-105, Jun. 2010.

(Continued)

*Primary Examiner* — Ellen Kim
(74) *Attorney, Agent, or Firm* — WPAT, PC; Justin King

(57) ABSTRACT

The optical coupler module for converting and transmitting electrical/optical signals includes a semiconductor substrate, a first film, a second film, an electrical transmission unit, at least one signal conversion unit and an optical waveguide structure. The first film and the second film are formed on opposite surfaces of the semiconductor substrate. The signal conversion unit and the optical waveguide structure are disposed on opposite sides of the semiconductor substrate. The optical waveguide structure has a reflector and a waveguide body. The optical signal generated from the signal conversion unit sequentially passes the first film, the semiconductor substrate and the second film and enters the optical waveguide structure. Then, the optical signal is reflected by the reflector and transmitted in the waveguide body to be outputted. Alternatively, the optical signal is transmitted in a reverse direction from the optical waveguide structure to the signal conversion unit.

20 Claims, 9 Drawing Sheets

(56) References Cited

U.S. PATENT DOCUMENTS

| | | | |
|---|---|---|---|
| 6,477,296 B1* | 11/2002 | Ogawa | 385/31 |
| 6,885,795 B1* | 4/2005 | Hsu et al. | 385/48 |
| 7,306,378 B2 | 12/2007 | Alduino et al. | |
| 7,369,718 B2* | 5/2008 | George et al. | 385/14 |
| 2002/0097962 A1 | 7/2002 | Yoshimura | |
| 2003/0103712 A1* | 6/2003 | Glebov et al. | 385/14 |
| 2005/0249462 A1 | 11/2005 | Alduino et al. | |
| 2006/0067608 A1 | 3/2006 | Kobayashi et al. | |
| 2008/0181561 A1 | 7/2008 | Furuyama | |
| 2009/0208167 A1 | 8/2009 | Hodono | |
| 2010/0067915 A1 | 3/2010 | Fukasaku et al. | |

FOREIGN PATENT DOCUMENTS

| | | |
|---|---|---|
| JP | 08-032102 | 2/1996 |
| JP | 08-110434 | 4/1996 |
| JP | 2002-131565 | 5/2002 |
| JP | 2002296434 | 10/2002 |
| JP | 2002543452 | 12/2002 |
| JP | 2003-262749 | 9/2003 |
| JP | 2004274155 | 9/2004 |
| JP | 2006-91241 | 4/2006 |
| JP | 2006-234850 A | 9/2006 |
| JP | 2007212915 | 8/2007 |

OTHER PUBLICATIONS

Ian O'Connor, Faress Tissafi-Drissi, Frédéric Gaffiot, Joni Dambre, Michiel De Wilde, Joris Van Campenhout, Dries Van Thourhout, Jan Van Campenhout, and Dirk Stroobandt, Systematic Simulation-Based Predictive Synthesis of Integrated Optical Interconnect, IEEE Transactions on VLSI Systems, vol. 15, No. 8, pp. 927-940, Aug. 2004.

Behnam Analui, Drew Guckenberger, Daniel Kucharski, and Adithyaram Narasimha, A Fully Integrated 20-Gb/s Optoelectronic Transceiver Implemented in a Standard 0.13-mm CMOS SOI Technology, IEEE Journal of Solid-State Circuits, vol. 41, No. 12, pp. 2945-2955, Dec. 2006.

Charles W. Holzwarth, Jason S. Orcutt, Hanqing Li, Miloš A. Popović, Vladimir Stojanović, Judy L. Hoyt, Rajeev J. Ram, and Henry I. Smith, Localized Substrate Removal Technique Enabling Strong-Confinement Microphotonics in Bulk Si CMOS Processes, CLEO/QELS 2008, paper CThKK5.

P. De Dobbelaere (1), B. Analui, E. Balmater, D. Guckenberger, M. Harrison, R. Koumans, D. Kucharski, Y. Liang, G. Masini, A. Mekis, S. Mirsaidi, A. Narasimha, M. Peterson, T. Pinguet, D. Rines, V. Sadagopan, S. Sahni, T.J. Sleboda, Y. Wang, B. Welch, J. Witzens, J. Yao, S. Abdalla, S. Gloeckner, G. Capellini (2), Demonstration of First WDM CMOS Photonics Transceiver with Monolithically Integrated Photo-Detectors, ECOC 2008, Sep. 21-25, 2008, Brussels, Belgium.

Sung Hwan Hwang, Dae Dong Seo, Jae Yong An, Myeong-Hyun Kim, Woo Chang Choi, Sung Ryul Cho, Sang Hwan Lee, Hyo-Hoon Park, and Han Seo Cho, Parallel Optical Transmitter Module Using Angled Fibers and a V-Grooved Silicon Optical Bench for VCSEL Array, IEEE Transactions on Advance Packaging, vol. 29, No. 3, pp. 457-462, Aug. 2006.

Yurii Vlasov, Silicon photonics for next generation computing systems, http://www.research.ibm.com/photonics/publications/ecoc_tutorial_2008.pdf (Sep. 22, 2008).

Holleman, Arnold F, "A text-book of organic chemistry", Jan. 1, 1985.

European Patent Office, "European search report", Aug. 26, 2011.

* cited by examiner

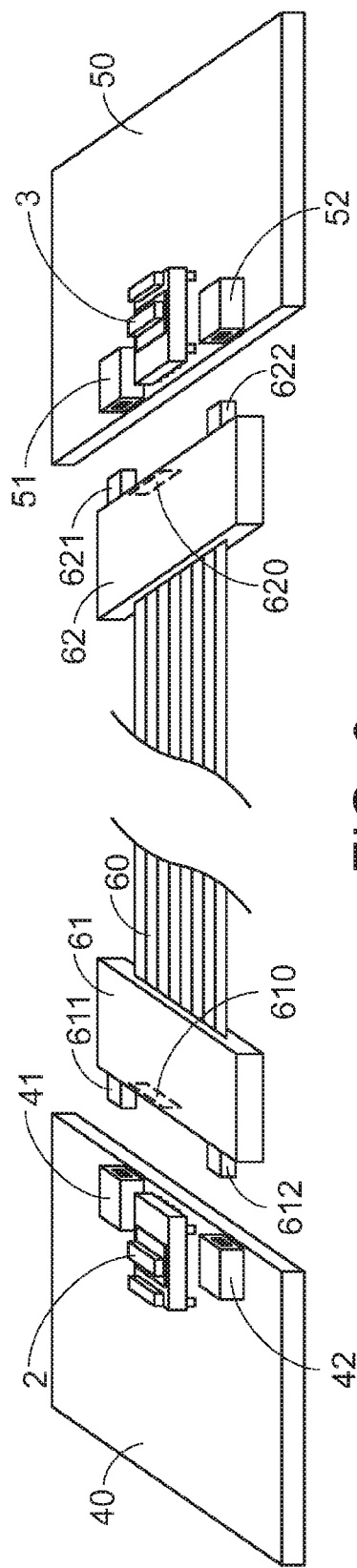

OPTICAL COUPLER MODULE HAVING OPTICAL WAVEGUIDE STRUCTURE

FIELD OF THE INVENTION

The present invention relates to an optical coupler module having an optical waveguide structure, and more particularly to a receiver module, a transmitter module or a transceiver module having the optical waveguide structure for converting and transmitting optical/electrical signals with total internal reflection phenomenon.

BACKGROUND OF THE INVENTION

Conventionally, copper wires are widely used for transmitting electrical signals or data between different components in a cheap and convenient way. In a high performance electronic system, since more and more processors are provided and the signal processing speed upgrades, it is important to enhance the quality and speed of transmitting the signals and data between the processors. However, the conventional copper wires fail to meet these requirements.

Compared with the electrical signals, optical signals can be transmitted over longer distances and at higher bandwidths. Therefore, optical connection is much emphasized nowadays, and the optical transmission gradually replaces the electrical transmission. For example, with development of light emitting diodes (LEDs) and semiconductor laser, light becomes suitable to be a transmission medium. An optical coupler device may be used to convert electrical signals into optical signals, convert optical signals into electrical signals, and emit and receive the electrical signals and optical signals. The optical coupler device includes for example an optical emitter or a light source unit for emitting optical signals, an optical receiver or a light-detecting unit for receiving optical signals, or a driver circuit or an amplifier circuit for driving these units or amplifying these signals. The optical emitter and the optical receiver are usually packaged in a coupler module and there is no electrical or physical connection therein. In other words, the electrical interference is eliminated as much as possible for the optical coupler device.

An optical coupler device has been described in U.S. Pat. No. 7,306,378. Please refer to FIG. 1A, a cross-sectional view illustrating the optical coupler device 101. The optical coupler device 101 includes a trench 105 defined in a semiconductor substrate 103. A reflector 107 is defined at a first end of the trench 105, and there is an angle between the reflector 107 and the lengthwise direction of the trench 105. An optical fiber 109 is disposed in the trench 105 at a second end of the trench 105. An optical device 111 is mounted on the semiconductor substrate 103 proximate to the trench 105 such that the optical device 111 is optically coupled to the optical fiber 109 via the reflector 107. The optical device 111 may be an optical emitter for outputting optical signals 113 or an optical receiver for receiving optical signals 113.

The semiconductor substrate 103 is mounted on a printed circuit board (PCB) 115 including contacts 117 which are electrically coupled to the semiconductor substrate 103. A circuit 125 is included in another semiconductor substrate 127 which is mounted on the semiconductor substrate 103 by contacts 131. The circuit 125 can drive or control the optical device 111 to convert electrical signals 119 from the contacts 117 into optical signals 113. The optical signals 113 are reflected by the reflector 107 and outputted through the optical fiber 109. In a reverse direction, the optical signals 113 inputted from the optical fiber 109 are reflected by the reflector 107 and received by the optical device 111. The optical signals 113 are converted into electrical signals 119 to be outputted through the contacts 117. A lid 133 is mounted over the semiconductor substrate 103 and encloses the optical device 111. The lid 133 protects the enclosed items.

A plurality of corresponding optical devices 111, trenches 105 and optical fibers 109 may be included in an optical coupler device 101. As shown in FIG. 1B, two optical coupler devices 101a and 101b, each including a plurality of corresponding optical devices 111, trenches 105 and optical fibers 109, are connected to each other through the representative optical fibers 109a and 109b to achieve signal transmission.

However, it is difficult to dig fine trenches in the semiconductor substrate. It is also difficult to dispose the optical fibers in the fine trenches. A slight error may affect the optical transmission because the light cannot travel in the optical coupler device precisely.

Therefore, there is a need of providing an optical coupler module which can be manufactured easily without complicated assembling and aligning action in order to obviate the drawbacks encountered from the prior art.

SUMMARY OF THE INVENTION

In accordance with an aspect of the present invention, there is provided an optical coupler module. The optical coupler module converts and transmits an electrical signal or an optical signal, and includes a semiconductor substrate, a first film, a second film, an electrical transmission unit, at least one signal conversion unit and an optical waveguide structure. The first film and the second film are formed on opposite surfaces of the semiconductor substrate. The electrical transmission unit is mounted on the first film and responsible for transmitting electrical signals. The signal conversion unit is mounted on and electrically connected to the electrical transmission unit for converting the electrical signal or the optical signal. The optical waveguide structure formed on the second film has a reflector and a waveguide body. The optical signal generated from the signal conversion unit sequentially passes the first film, the semiconductor substrate and the second film and enters the optical waveguide structure. Then, the optical signal is reflected by the reflector and transmitted in the waveguide body to be outputted. Alternatively, the optical signal is transmitted in a reverse direction from the optical waveguide structure to the signal conversion unit.

In accordance with another aspect of the present invention, there is provided another optical coupler module. The optical coupler module converts and transmits an electrical signal or an optical signal, and includes a semiconductor substrate, a first film, a second film, a control circuit, at least one signal conversion unit and at least one optical waveguide structure. The first film and the second film are formed on opposite surfaces of the semiconductor substrate. The control circuit with operation function is mounted on the first film and adjacent to the first film. The signal conversion unit is mounted above the first film and electrically connected to the control circuit for converting the electrical signal or the optical signal. The optical waveguide structure formed on the second film has a reflector and a waveguide body. The optical signal generated from the signal conversion unit sequentially passes the first film, the semiconductor substrate and the second film and enters the optical waveguide structure. Then, the optical signal is reflected by the reflector and transmitted in the waveguide body to be outputted. Alternatively, the optical signal is transmitted in a reverse direction from the optical waveguide structure to the signal conversion unit.

BRIEF DESCRIPTION OF THE DRAWINGS

The above contents of the present invention will become more readily apparent to those ordinarily skilled in the art after reviewing the following detailed description and accompanying drawings, in which:

FIG. 6 is a schematic diagram showing the optical connection between the transmitter module and the receiver module according to the present invention;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

From above description, the structure of the conventional optical coupler device, e.g. transmitter module and receiver module is too complicated to be easily and precisely manufactured. The optical transmission between the optical coupler device and the optical fiber is possibly affected due to a slight assembly error.

According to the present invention, an optical coupler module, e.g. a transmitter module for electrical-optical signal conversion, a receiver module for optical-electrical signal conversion or a transceiver module for both conversions is disclosed. The optical coupler module is manufactured by easier semiconductor process and can be assembled under certain tolerance, but with excellent quality of signal conversion and transmission.

Figure 1A:
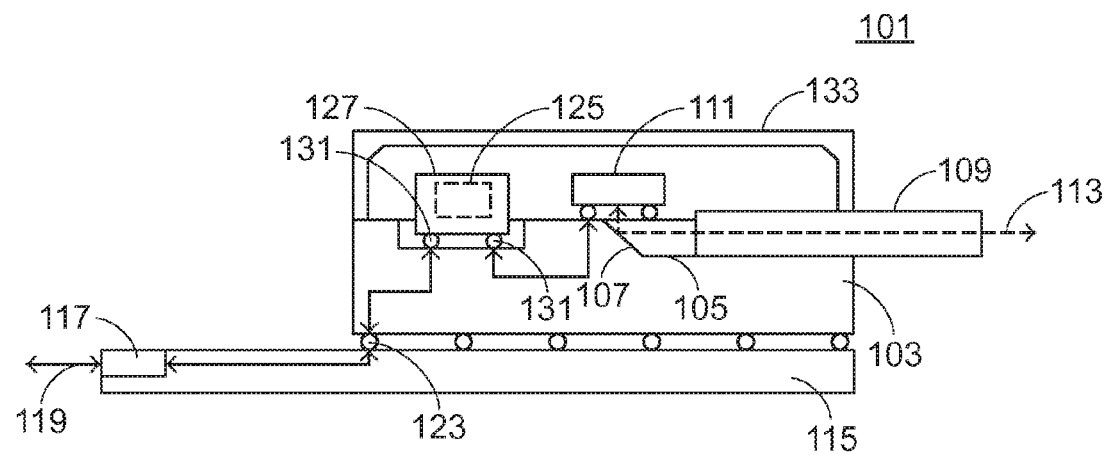
FIG. 1A is a cross-sectional view illustrating a conventional optical coupler device.
Figure 1B:
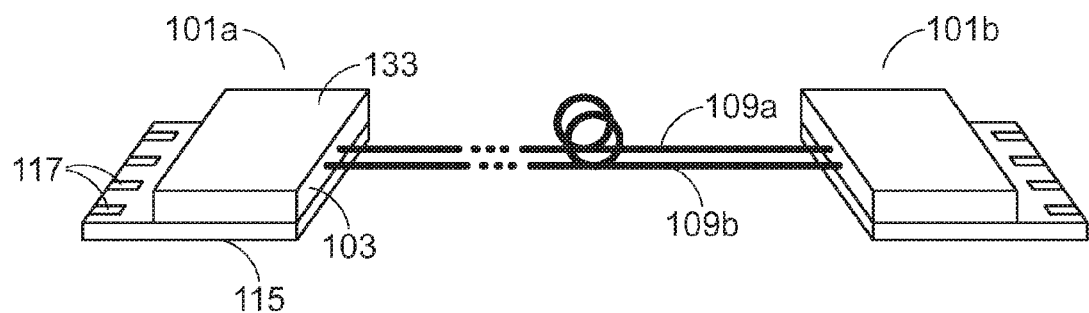
FIG. 1B is a schematic diagram showing the connection between two optical coupler devices.
Figure 2A:
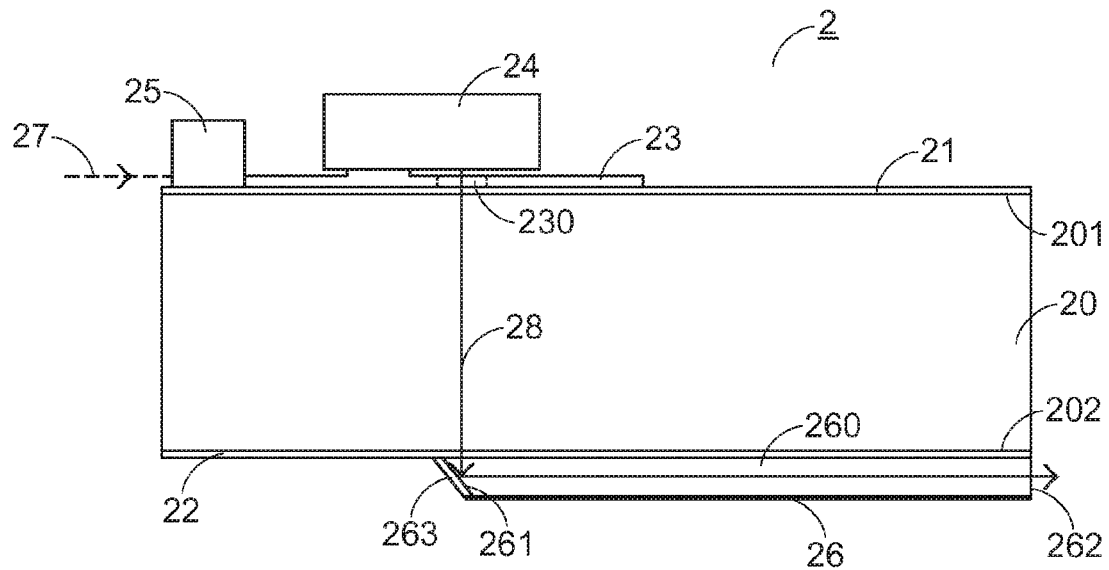
FIG. 2A is a cross-sectional view illustrating an embodiment of a transmitter module according to the present invention.

Please refer to FIG. 2A, a cross-sectional view illustrating an embodiment of a transmitter module according to the present invention. The transmitter module 2 includes a semiconductor substrate 20, a light source unit 24 and an optical waveguide structure 26. The semiconductor substrate 20 supports the light source unit 24 on its surface. In an embodiment, the semiconductor substrate 20 is a monocrystalline silicon substrate in a form of double-sided polished silicon-on-insulator (SOI) wafer, but is not limited to this. The semiconductor substrate 20 should be penetrable to optical signals.

A first film 21 and a second film 22 are formed on two opposite surfaces 201 and 202 of the semiconductor substrate 20, respectively. The first film 21 provides electrical-insulating effect and confines electrical/optical signals to avoid electrical interference in optical transmission. Since the optical signals travel through the first film 21 and the second film 22, the films 21 and 22 should be penetrable to optical signals as the semiconductor substrate 20. In an embodiment, each of the films 21 and 22 is a single layer film made of silicon oxide, which is easily formed on the surface 201 or 202 of the semiconductor substrate 20 by known technology to assist the transmission of the optical signals. In another embodiment, each of the films 21 and 22 is a multi-layer film with anti-reflecting coating. Similarly, the second film 22 may provide electrical-insulating effect and confine electrical/optical signals. Furthermore, the films 21 and 22 can increase the tolerance of wavelength, angle of incidence and low polarization dependence.

The light source unit 24 may include a light-emitting diode (LED), a semiconductor laser or a vertical cavity surface emitting laser (VCSEL) capable of emitting light beams or optical signals in response to electrical signals. The transmitter module 2 further includes an electrical transmission unit 23 on the first film 21. The light source unit 24 is mounted on and electrically connected to the electrical transmission unit 23. The transmitter module 2 may be mounted on or electrically connected to a printed circuit board to allow the transmitter module 2 to receive electrical signals 27 to be transmitted from the printed circuit board.

The transmitter module 2 further includes a driving circuit 25 mounted on the first film 21 and electrically connected to the electrical transmission unit 23. The driving circuit 25 drives the light source unit 24 through the electrical transmission unit 23 to generate optical signals 28 in response to the electrical signals 27. The light source unit 24 is mounted on the electrical transmission unit 23 wherein a portion of the bottom area of the light source unit 24 touches the electrical transmission unit 23 to achieve the electrical connection.

In an embodiment, the transmitter module 2 may be implemented by system on chip (SoC) technology so that operation function is also integrated into the chip. For example, the integrated circuit (IC) with operation function is integrated into the driving circuit 25. Therefore, the driving circuit 25 may not only drive the light source unit 24 but also perform operation functionality.

In an embodiment, the electrical transmission unit 23 is made of metallic material for transmitting the electrical signals 27. Furthermore, the metallic material is advantageous to dissipate heat generated from the light source unit 24 during the conversion from the electrical signals 27 into the optical signals 28. The electrical transmission unit 23 made of metallic material and interfaced between the light source unit 24 and the first film 21 may effectively dissipate the heat by conduction or radiation.

Since the electrical transmission unit 23 is not penetrable to optical signals 28, a via hole 230 is formed on the electrical transmission unit 23 so that the electrical transmission unit 23 does not obstruct the light path of the optical signals 28. Therefore, the optical signals 28 can pass the via hole of the electrical transmission unit 23, the first film 21 and the semiconductor substrate 20 for optical transmission. Although a via hole 230 is provided on the electrical transmission unit 23, the small size of the via hole 230 does not affect the heat-dissipation effect of the electrical transmission unit 23.

In an embodiment, the optical waveguide structure 26 is made of the same silicon material as the semiconductor substrate 20. The optical waveguide structure 26 is formed on the second film 22 and the position of the optical waveguide structure 26 corresponds to the position of the light source unit 23 so that the optical signals 28 provided by the light source unit 24 can enter the optical waveguide structure 26. The optical waveguide structure 26 includes a reflector 263 and a waveguide body 260. The optical signals 28 are reflected by the reflector 263 and the reflected optical signals 28 are transmitted along an axial or lengthwise direction of the waveguide body 260. In practice, the reflector 263 is arranged at a first end of the optical waveguide structure 26 and corresponds to the light source unit 24 so that the optical signals 28 can reach the reflector 263.

In an embodiment, there is an angle of 45° between the reflector 263 and the second film 22. The 45° angle may direct the optical signals 28 to an optimal transmission direction. Preferably, the semiconductor substrate 20, the first film 21, the second film 22 and the optical waveguide structure 26 are formed in a semiconductor process. Particularly, after the second film 22 is formed on the second surface 202 of the semiconductor substrate 20, another silicon layer is formed on the second film 22. The silicon layer is partially etched to form a 45° slant surface at the first end 261. Suitable reflective coating is applied to the slant surface to form the reflector 263. Then, the light source unit 24, the electrical transmission unit 23 and the driving circuit 25 are mounted on the first film 21 by wafer bonding.

As described above, the first film 21 and the second film 22 are dielectric films and penetrable to optical signals. The light source unit 24 emits the optical signals 28 in a "vertical" direction nearly normal to the second film 22 or the lengthwise direction of the optical waveguide structure 26. The optical signals 28 passes the first film 21, the semiconductor substrate 20 and the second film 22 to enter the first end 261 of the optical waveguide structure 26. Then, the optical signals 28 are reflected by the 45° reflector 263, transmitted by the waveguide body 260, and outputted from a second end 262 of the optical waveguide structure 26.

Figure 2B:
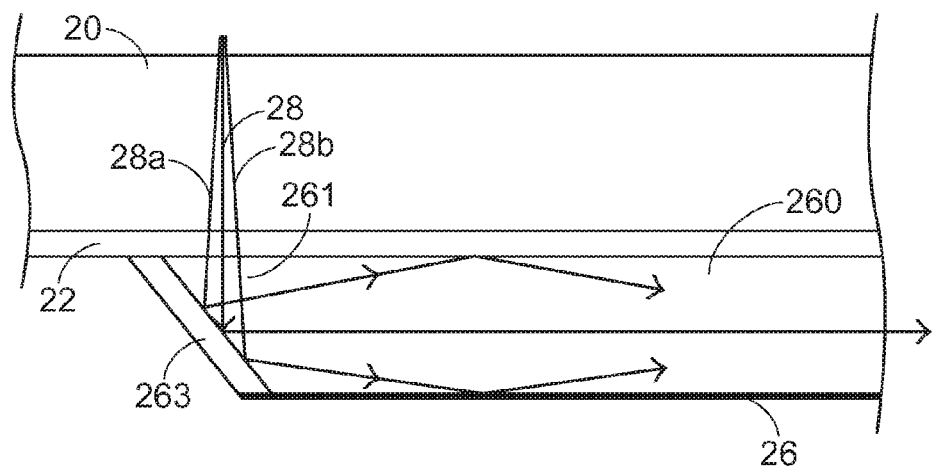
FIG. 2B is schematic diagram showing light path of the optical signals in the transmitter module of FIG. 2A.

FIG. 2B shows the light path of the optical signals 28 in the transmitter module 2. If the optical signals 28 enter the optical waveguide structure 26 at the first end 261 with an angle of incidence of 45°, the optical signals 28 are reflected and the reflected light direction is perpendicular to the incident direction. Therefore, the light path is parallel with the lengthwise direction of the waveguide body 260 and little energy loss occurs during the transmission.

However, the light source unit 24 does not always emit "perfect" vertical light, that is, little scatter can not be avoided. For example, optical signals 28a and 28b enter the optical waveguide structure 26 at the first end 261 with little deviation from the perfect optical signals 28. The light paths of the reflected optical signals 28a and 28b are not parallel with the lengthwise direction of the waveguide body 260, and the reflected optical signals 28a and 28b will reach the surface of the waveguide body 260. It is to be noted that the angle of incidence is greater than the critical angle for the interface between the waveguide body 260 and the second film 22 or the surrounding air. Therefore, total internal reflection occurs and the optical signals 28a and 28b do not escape form the waveguide body 260. From the description, it is realized that the index of refraction of the second film 22 and the optical waveguide structure 26 should be taken into consideration to ensure total internal reflection. In particular, the index of refraction of the second film 22 should be smaller than that of the optical waveguide structure 26.

Figure 3A:
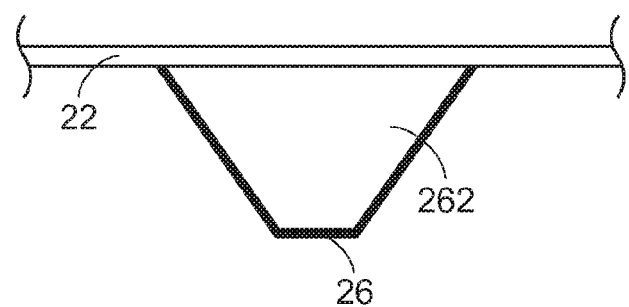
FIG. 3A is a cross-sectional view illustrating the profile of the optical waveguide structure in FIG. 2A.
Figure 3B:
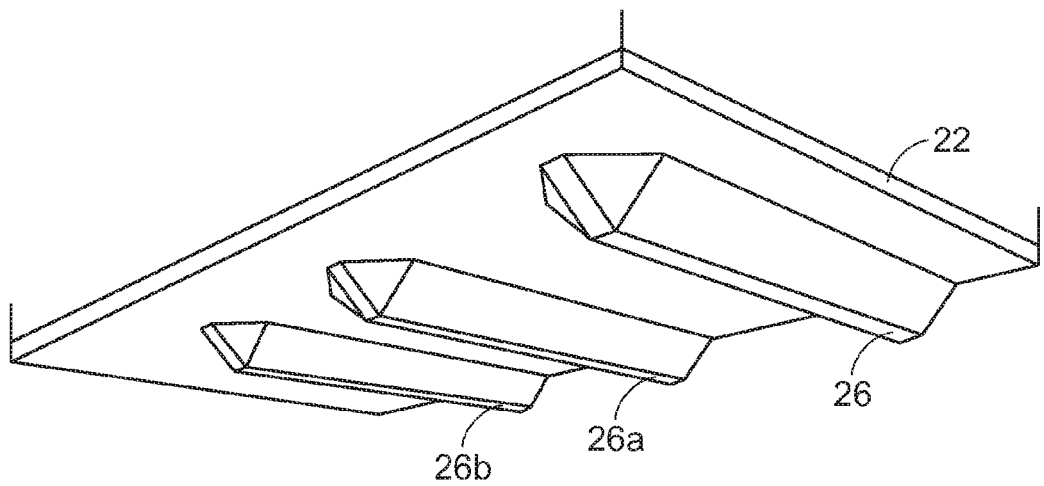
FIG. 3B is a perspective view showing the bottom of the transmitter module of FIG. 2A.

Please refer to FIG. 3A, showing a profile of the second end 262 of the optical waveguide structure 26. As shown in FIG. 3A, the optical waveguide structure 26 has two symmetrical lateral surfaces, but is not limited to this. Please also refer to FIG. 3B showing the bottom of the transmitter module 2. In general, the optical signals 28 are transmitted to the reflector 263, and total internal reflection occurs on the top surface and the bottom surface of the waveguide body 260. Therefore, the profile of the optical waveguide structure 26 has no particular restriction. Any profile with 45° slant surface for the reflector 263 and is easily obtained by an etching step is practicable.

As shown in FIG. 3B, there are a plurality of optical waveguide structures 26, 26a and 26b provided on the second film 22. In practice, the transmitter module 2 may include more than one light source unit and corresponding optical waveguide structure to perform the optical transmission. In this embodiment, the positions of the reflectors of the optical waveguide structures 26, 26a and 26b correspond to three light source units, respectively, so that the reflector of each of the optical waveguide structures 26, 26a and 26b may receive an optical signal from a corresponding light source unit.

Figure 4:
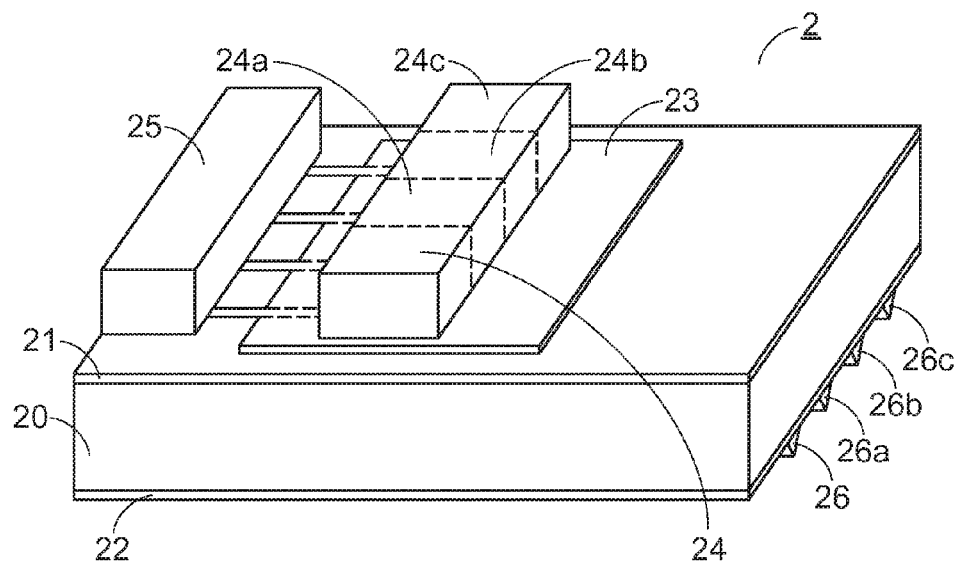
FIG. 4 is a perspective view illustrating the transmitter module according to the present invention.

Please refer to FIG. 4, a perspective view illustrating the transmitter module 2. The transmitter module 2 includes four light source units 24, 24a, 24b and 24c for emitting optical signals. The four optical waveguide structures 26, 26a, 26b and 26c provided on the second film 22 receive optical signals from the corresponding light source units 24, 24a, 24b and 24c. The electrical transmission unit 23 includes four transmission lines connected to the driving circuit 25. Therefore, the driving circuit 25 drives the four light source units 24, 24a, 24b and 24c through the four transmission lines to generate four optical signals in response to four electrical signals to be transmitted by the four optical waveguide structures 26, 26a, 26b and 26c.

The above-described embodiments of transmitter modules convert electrical signals into optical signals and output the optical signals through the optical waveguide structure. According to the same design principle, a receiver module may be provided to receive optical signals, convert the optical signals into electrical signals, and output the electrical signals.

Figure 5:
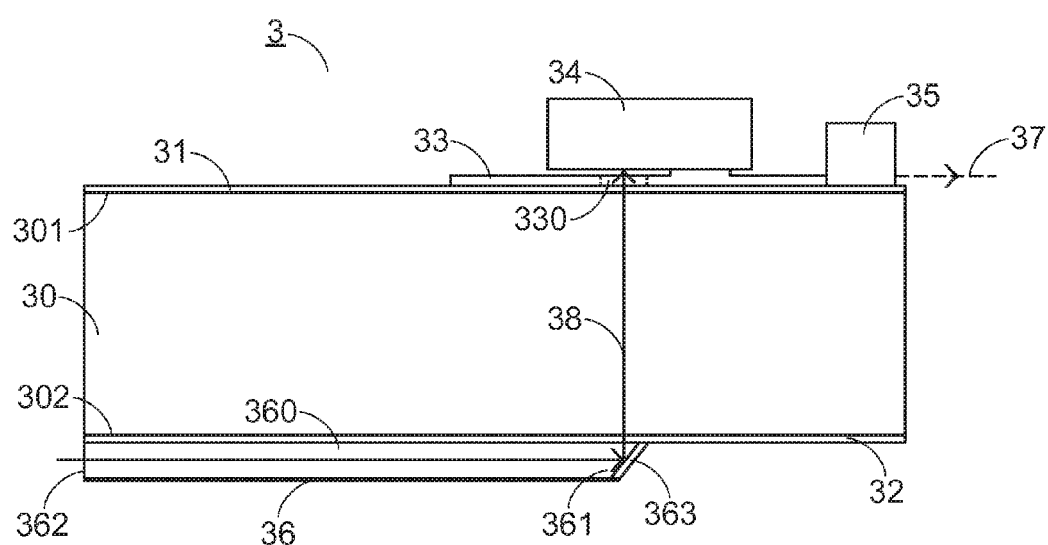
FIG. 5 is a cross-sectional view illustrating an embodiment of a receiver module according to the present invention.

Please refer to FIG. 5, a cross-sectional view illustrating an embodiment of a receiver module according to the present invention. The receiver module 3 includes a semiconductor substrate 30, a light-detecting unit 34, an optical waveguide structure 36, an electrical transmission unit 33, an amplifier circuit 35, and two films 31 and 32 on opposite surfaces 301 and 302. In other words, the light source unit 24 and the driving circuit 25 of the transmitter module 2 are replaced by the light-detecting unit 34 and the amplifier circuit 35 in the receiver module 3. The detailed structure, material and function of the other components of the receiver module 3 are similar to those of the transmitter module 2 except the signal transmission direction and the conversion from the optical signal 38 into the electrical signal 37.

The light-detecting unit 34 may include a photodiode or a photodetector capable of receiving and converting the optical signals 38 into electrical signals 37 for further transmission. The amplifier circuit 35 is usually implemented by a transimpedance amplifier. In particular, the optical waveguide structure 36 receives the external optical signals 38 at the second end 362, and the optical signals 38 are transmitted along the lengthwise direction of the waveguide body 360 with or without total internal reflection. Then, the reflector 363 with a 45° slant surface at the first end 361 reflects the optical signals 38 to allow the optical signals 38 to pass through the second film 32, the semiconductor substrate 30, the first film 31 and the via hole 330 to reach the light-detecting unit 34. Then, the optical signals 38 are converted into the electrical signals 37 by the light-detecting unit 34.

Similarly, the receiver module 3 may be mounted on and electrically connected to a printed circuit board. The amplifier circuit 35 amplifies and outputs the electrical signals 37 to the printed circuit board. The electrical transmission unit 33 made of metallic material and interfaced between the light-detecting unit 34 and the first film 31 may effectively dissipate the heat generated by the light-detecting unit 34 by conduction or radiation.

The receiver module 3 may be implemented by a system on chip (SoC) technology so that operation function is also integrated into the chip. For example, the IC with operation function is integrated into the amplifier circuit 35. Therefore, the amplifier circuit 35 may not only amplify the electrical signals 37 but also perform operation functionality.

The receiver module 3 may include a plurality of light-detecting unit 34 and corresponding optical waveguide structures 36 as above described with reference to FIG. 4 to perform multiple optical-electrical conversion and transmission.

The optical coupler module according to the present invention has been described in the form of the transmitter module 2 and the receiver module 3. In another embodiment, the optical coupler module may be a transceiver module by integrating the transmitter module 2 of FIG. 2A and the receiver module 3 of FIG. 5 capable of transmitting and receiving optical signals. For example, the optical coupler module of FIG. 4 may include at least one light source unit and at least one light-detecting unit. Each one of the light source unit and the light-detecting unit is optically coupled to a corresponding optical waveguide structure.

The optical coupler module, e.g. the transmitter module, the receiving module or the transceiver module should be coupled to an optical transmission element such as an optical fiber so that the optical coupler module may receive optical signals form the optical transmission element or transmits optical signals to the optical transmission element. Please refer to FIG. 6 showing the connection between the transmitter module and the receiver module according to the present invention. The transmitter module 2 and the receiver module 3 are respectively mounted on and electrically connected to the printed circuit boards 40 and 50. The printed circuit board 40 provides electrical signals to the transmitter module 2, and the printed circuit board 50 receives electrical signals form the receiver module 3.

There are pin guides 41, 42, 51 and 52 provided on the printed circuit boards 40 and 50 for assembly of the printed circuit boards 40 and 50 and the optical fibers 60. Corresponding to the pin guides 41, 42, 51 and 52, there are pins 611, 612, 621 and 622 provided on two connectors 61 and 62 at two ends of the optical fibers 60. By plugging the pins 611, 612, 621 and 622 into the corresponding pin guides 41, 42, 51 and 52, the optical waveguide structures 26 and 36 of the transmitter module 2 and the receiver module 3 are optically coupled to the transmission interfaces 610 and 620. Therefore, the optical signals may enter and leave the optical fibers 60 through the transmission interfaces 610 and 620.

It is to be noted that different connectors may be utilized and connected to the two ends of the optical fibers 60. For example, one of the transmitter module 2 and the receiver module 3 is coupled to one end of the optical fibers 60 through the connector 61 or 62 according to the present invention, while a conventional receiver module or transmitter module, e.g. optical coupler device with trenches as described in the prior arts, may be coupled to the other end of the optical fibers 60 through a conventional connector.

Please note that various modifications can be made to the transmitter module and the receiver module concerning the position or the arrangement of the control circuit such as the driving circuit or the amplifier circuit.

Figure 7A:
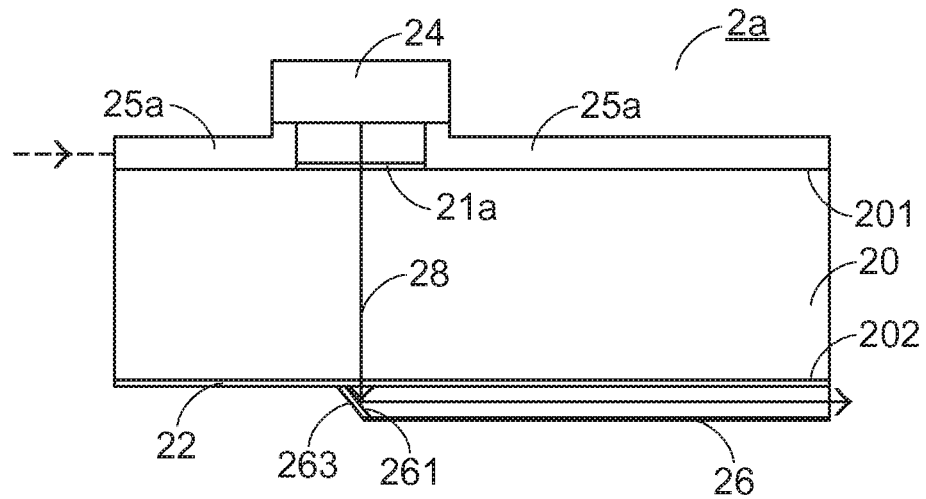
FIGS. 7A-7D are schematic diagrams showing different modified embodiments of the transmitter modules according to the present invention.

Please refer to FIG. 7A showing another embodiment of the transmitter module 2a. Compared with the above-described embodiment of the transmitter module 2, the first film 21a does not cover all the first surface 201 of the semiconductor substrate 20. Only a portion of the first surface 201 where the light path of the optical signals 28 passes is covered by the first film 21a. The first film 21a is penetrable to optical signals 28 and anti-reflective. The driving circuit 25a is mounted on the other portion of the first surface 201 and adjacent to the first film 21a. According to the design, the electrical transmission unit is integrated into the driving circuit 25a, for example, the portion of the driving circuit 25a under the light source unit 24. Therefore, the driving circuit 25a forms a circuit layer on the first surface 201. The circuit layer is made by less line-width process, while the photonic layer is made by greater line-width process. Thus, the circuit layer and the photonic layer formed with different line-width processes are integrated on the silicon substrate 20 to form a monolithic optical-electrical/electrical-optical element.

Figure 7B:
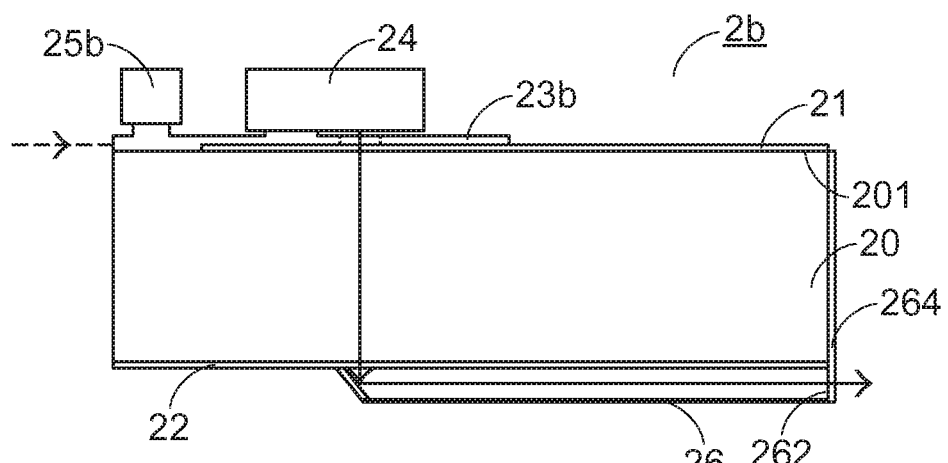

Please refer to FIG. 7B illustrating another embodiment of the transmitter module 2b. Compared with the above-described embodiment of the transmitter module 2, the electrical transmission unit 23b is extended to cover the first surface 201 under the driving circuit 25b. The driving circuit 25b is mounted on the electrical transmission unit 23b by flip-chip process based on hybrid integration technique and electrically connected to the electrical transmission unit 23b. Preferably, the top surface of the driving circuit 25b is aligned with the top surface of the light source unit 24. Besides, a third film 264 is formed on the second end of the optical waveguide structure 26. The material of the third film 264 may be the same as the first film 21 and the second film 22. The third film 264 can be applied to all the above-described embodiments.

Figure 7C:
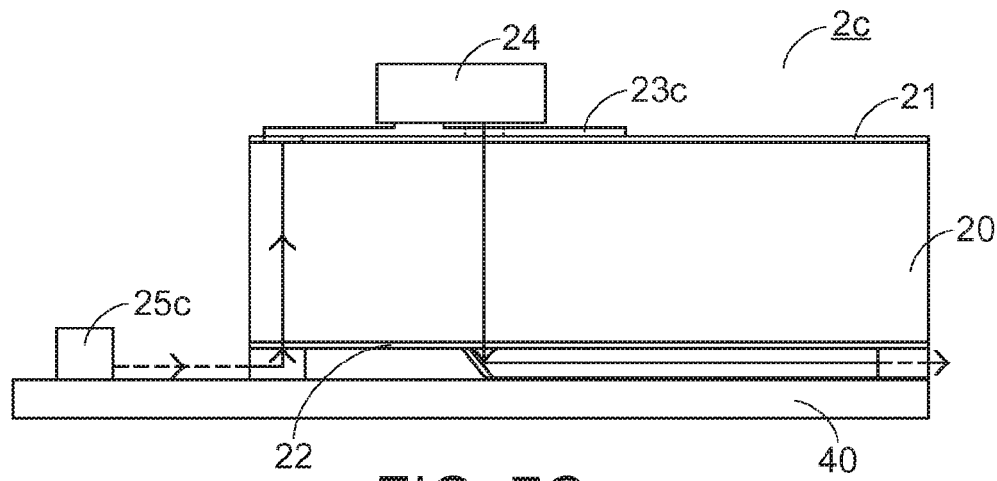
Figure 7D:
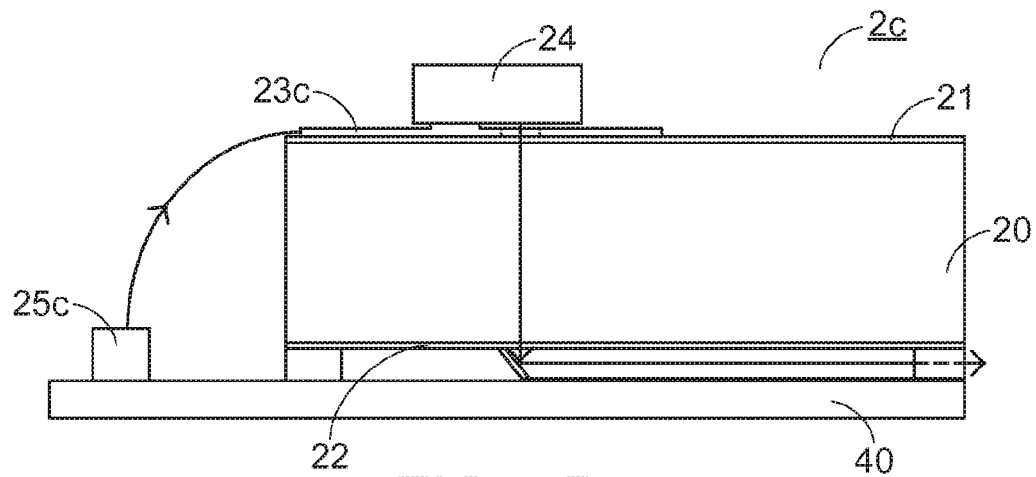

Please refer to FIGS. 7C and 7D illustrating other embodiments of the transmitter modules 2c and 2d. The driving circuit 25c is located on the printed circuit board 40 rather than on the electrical transmission unit 23c. To electrically connect the driving circuit 25c to the electrical transmission unit 23c, an interconnect structure may be formed in the semiconductor substrate 20 to communicate the driving circuit 25c and the electrical transmission unit 23c, as shown in FIG. 7C. Alternatively, the driving circuit 25c may be electrically connected to the electrical transmission unit 23c by a wire, as shown in FIG. 7D. It is to be noted that the modifications, as described with reference to FIGS. 7A-7D, to the transmitter module 2 can be applied to the receiver module 3 or the transceiver module.

Since the semiconductor substrate 20 and 30 separates the signal conversion unit, e.g. light source unit 24 and the light-detecting unit 34 from the optical waveguide structures 26 and 36, the optical signals 28 and 38 transmitted in the optical waveguide structures 26 and 36 are not affected by electrical interference. Furthermore, coupling the optical fibers to the optical waveguide structures 26 and 36 will not damage the sophisticated light source unit 24 and light-detecting unit 34. In addition to the connector 61 or 62 for coupling the optical fibers to the optical coupler module 2 or 3, various modifications can be made to the assembly of the optical transmission system.

Figure 8A:
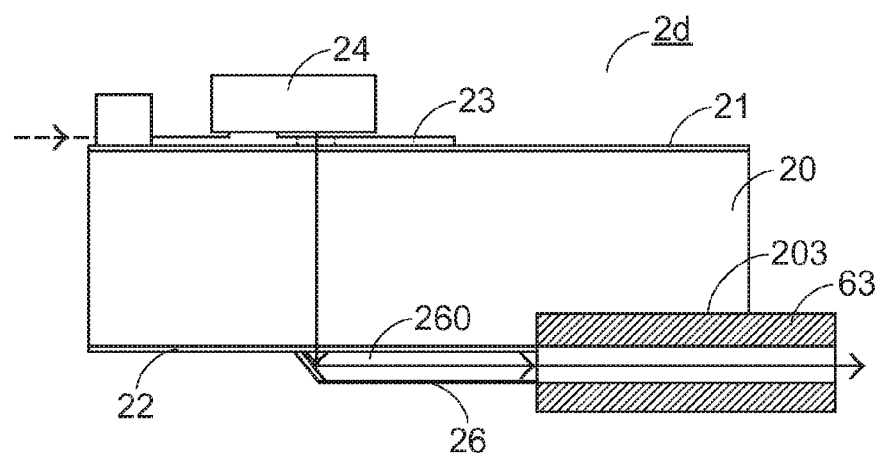
FIG. 8A is a cross-sectional view illustrating another modified embodiment of the transmitter module of FIG. 2A according to the present invention.

Please refer to FIG. 8A illustrating another embodiment of a transmitter module according to the present invention. A trench 203 is provided in the semiconductor substrate 20 near the second end of the optical waveguide structure 26 for accommodating the optical fiber 63. The profile of the trench 203 depends on the cross-section of the optical fiber 63, for example, U-shape or V-shape. When the optical fiber 63 is put in the trench 203, the optical fiber 63 is coupled to the optical waveguide structure 26. In this embodiment, the optical fiber 63 is fixed to the transmitter module 2 and cannot be removed. However, a pluggable design is applicable without affecting or damaging the light source unit 24 since the light source unit 24 is located at the other surface of the semiconductor substrate 20. The same design can be applied to other type of optical coupler module such as the receiver module or the transceiver module.

Figure 8B:
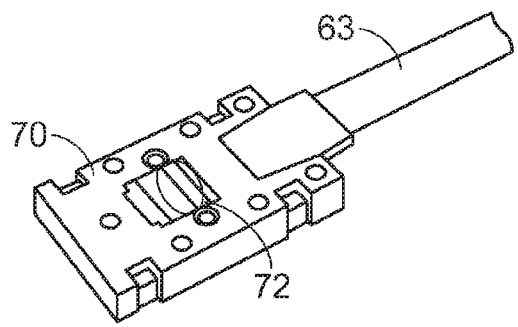
FIG. 8B is a perspective diagram illustrating a connector for the optical coupler module of the present invention.
Figure 8C:
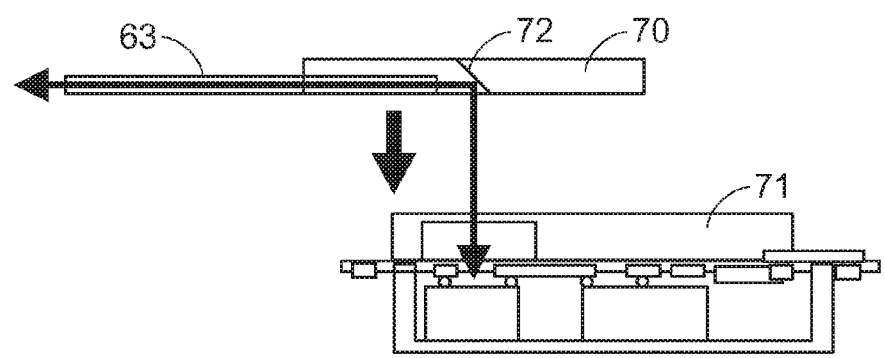
FIG. 8C is a schematic diagram showing the coupling of the connector of FIG. 8B to a transmission interface according to the present invention.

Please refer to FIGS. 8B and 8C illustrating a connector at the other end of the optical fiber 63. The connector 70 of the optical fiber 63 will be optically coupled to a transmission interface 71 which is mounted on a circuit board or a mainboard. The connector 70 has a 45° reflector 72 for changing the transmission direction of the optical signals and direct the optical signals into the transmission interface 71 for further transmission.

Figure 9:
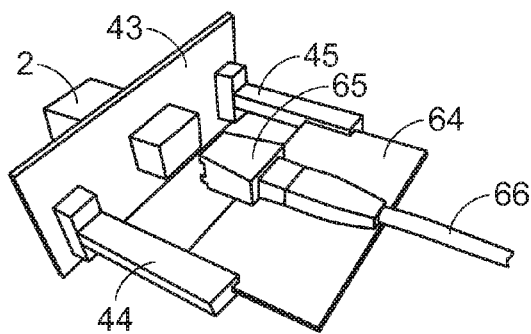
FIG. 9 is a schematic diagram showing the coupling of an optical fiber to the transmitter module according to the present invention.

FIG. 9 illustrates a pluggable design for the transmitter module 2. The transmitter module 2 is fixed to a first board 43 having thereon two guiding rails 44 and 45. The connector 65 of the optical fiber 66 is disposed on a second board 64. When the second board 64 is inserted in and moving along the guiding rails 44 and 45 to be close to the transmitter module 2, the optical fiber 66 is optically coupled to the second end of the optical waveguide structure for receiving optical signals from the transmitter module 2. In addition, other securing parts such as screw or bolt may be utilized to further secure the assembly. The same design can be applied to other type of optical coupler module such as the receiver module or the transceiver module.

Figure 10A:
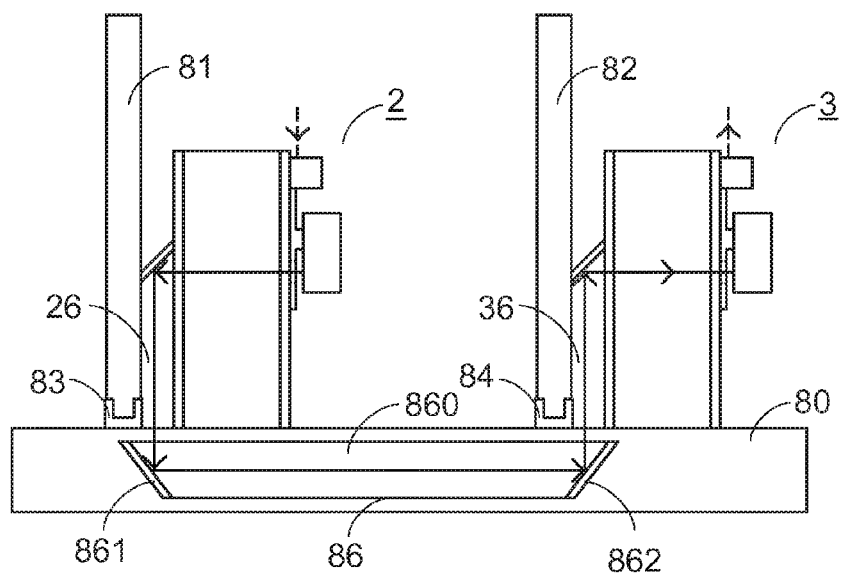
FIG. 10A is a schematic diagram showing the optical connection between a transmitter module and a receiver module according to the present invention.

Please refer to FIG. 10A showing the optical connection between the transmitter module and the receiver module according to the present invention. The transmitter module 2 and the receiver module 3 are disposed on the cards 81 and 82, respectively, and communicate with each other through the printed circuit board 80. There is an optical waveguide structure 86 in the printed circuit board 80. The optical waveguide structure 86 includes a waveguide body 860 and two 45° reflectors 861 and 862 at two ends. When the cards 81 and 82 are inserted into the slots 83 and 84 on the printed circuit board 80, the optical waveguide structures 26 and 36 are optically coupled to the optical waveguide structure 86. Thus, the transmitter module 2 outputs the optical signals from the second end of the optical waveguide structure 26 to the first end of the optical waveguide structure 86 in the printed circuit board 80. The optical signals are reflected by the reflector 861 at the first end of the optical waveguide structure 86 and transmitted along the lengthwise direction of the waveguide body 860. Then, the optical signals are reflected by the reflector 862 at the second end of the optical waveguide structure 86. At last, the receiver module 3 receives the optical signals at the second end of the optical waveguide structure 36 from the optical waveguide structure 86. Therefore, the optical transmission element is not limited to an optical fiber and may be extended to a printed circuit board. In an embodiment, the optical waveguide structure 86 in the printed circuit board 80 may be made of a polymer material.

Figure 10B:
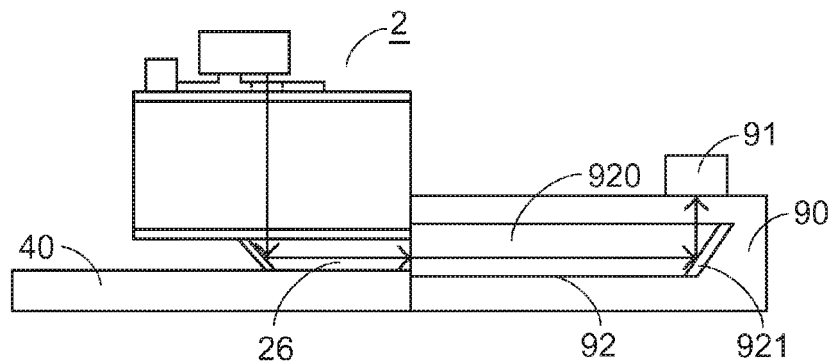
FIG. 10B is a schematic diagram showing the optical connection between a transmitter module and a chip according to the present invention.

Please refer to FIG. 10B showing the optical connection between the transmitter module and a chip according to the present invention. The transmitter module 2 is mounted on a first printed circuit board 40, and the chip 91 is mounted on a second printed circuit board 90 having therein an optical waveguide structure 92. When the two printed circuit boards 40 and 90 are combined together, the two optical waveguide structures 26 and 92 are optically coupled to each other. The optical signals outputted from the optical waveguide structure 26 enter the waveguide body 920 and reach the reflector 921. The reflected optical signals are received by the chip 91 mounted on the second printed circuit board 90. Hence, the optical transmission between different printed circuit boards may be achieved. The same design can be applied to other type of optical coupler module such as the receiver module or the transceiver module.

From above description, the present invention provides an optical coupler module for electrical-optical or optical-electrical conversion. The optical coupler module can be manufactured by a simple semiconductor process. The optical coupler module can be easily coupled to an optical transmission element such as optical fiber without complicated assembly and the assembly tolerance increases. Since the electrical element and the optical element are arranged on opposite surfaces of the semiconductor substrate, the optical element, e.g. the optical waveguide structure will not affected by the electrical interference, and the electrical element such as the light source unit or the light-detecting unit will not be damaged during the assembly of the optical element and external optical transmission element. The optical coupler module according to the present invention may be coupled to different transmission element, e.g. optical fiber or printed circuit board with optical waveguide structure. Therefore, the wide application of the present invention is expected.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An optical coupler module for converting and transmitting an electrical signal or an optical signal, the optical coupler module comprising:

a semiconductor substrate having a first surface and a second surface opposite to the first surface;

a first film and a second film formed on the first surface and the second surface, respectively;

an electrical transmission unit formed on the first film or the first surface for transmitting the electrical signal;

at least one signal conversion unit mounted on and electrically connected to the electrical transmission unit, for converting the electrical signal into a corresponding optical signal or converting the optical signal into a corresponding electrical signal; and a first optical waveguide structure formed on the second film and having a reflector at a first end and a waveguide body, the position of the reflector corresponding to the signal conversion unit, and the waveguide body of the first optical waveguide structure being made of silicon and having a V-shaped cross section along a lengthwise direction thereof, wherein the corresponding optical signal sequentially passes the first film, the semiconductor substrate and the second film and enters the first optical waveguide structure so that the corresponding optical signal is reflected by the reflector and transmitted in the waveguide body to a second end of the first optical waveguide structure;

or the optical signal is transmitted in the waveguide body from the second end of the first optical waveguide structure and reflected by the reflector, and the optical signal sequentially passes the second film, the semiconductor substrate and the first film to reach the signal conversion unit to be converted into the corresponding electrical signal.

2. The optical coupler module according to claim 1 wherein the semiconductor substrate is a double-sided polished silicon-on-insulator (SOI) wafer, and the first film and the second firm are dielectric films.

3. The optical coupler module according to claim 1 wherein the optical coupler module is mounted on and electrically connected to a printed circuit board, the optical coupler module receiving the electrical signal form the printed circuit board or outputting the corresponding electrical signal to the printed circuit board.

4. The optical coupler module according to claim 1 wherein the electrical transmission unit is made of metallic material, and a portion of the electrical transmission unit touches the signal conversion unit to dissipate heat generated from the signal conversion unit.

5. The optical coupler module according to claim 1 wherein the first optical waveguide structure is made of silicon, and there is a 45° angle between the reflector and the second film.

6. The optical coupler module according to claim 1 wherein the optical signal or the corresponding optical signal is transmitted in the waveguide body by total internal reflection.

7. The optical coupler module according to claim 1 wherein the first optical waveguide structure and the semiconductor substrate are integrally formed, and the reflector is a slant surface coated with a reflective material.

8. The optical coupler module according to claim 1 wherein the second end of the first optical waveguide structure is optically coupled to a second optical waveguide structure of a printed circuit board or an optical fiber to allow the optical signal or the corresponding optical signal transmitted between the first optical waveguide structure and the second optical waveguide structure or the optical fiber.

9. The optical coupler module according to claim 1 wherein the optical coupler module comprises a third film formed on the second end of the first optical waveguide structure.

10. The optical coupler module according to claim 9 wherein each of the first film, the second film and the third film is a single layer film or a multi-layer film with anti-reflective function, which is penetrable to the optical signal or the corresponding optical signal and increases tolerance of wavelength, angle of incidence and low polarization dependence.

11. The optical coupler module according to claim 1 wherein the optical coupler module is a transmitter module, and the signal conversion unit is a light source unit including a light-emitting diode (LED), a semiconductor laser or a vertical cavity surface emitting laser (VCSEL) for generating the corresponding optical signal in response to the electrical signal.

12. The optical coupler module according to claim 11 wherein the transmitter module comprises a driving circuit disposed on the first film or a printed circuit board and electrically connected to the electrical transmission unit for driving the light source unit through the electrical transmission unit to generate the corresponding optical signal in response to the electrical signal.

13. The optical coupler module according to claim 11 wherein the electrical transmission unit is formed on the first surface of the semiconductor, and the transmitter module comprises a driving circuit disposed on and electrically connected to the electrical transmission unit for driving the light source unit through the electrical transmission unit to generate the corresponding optical signal in response to the electrical signal.

14. The optical coupler module according to claim 13 wherein the driving circuit is implemented by a system on chip technology to integrate an integrated circuit with operation function into the driving circuit.

15. The optical coupler module according to claim 12 wherein the optical coupler module further comprises:
a second optical waveguide structure formed on the second film; and
a light-detecting unit mounted on and electrically connected to the electrical transmission unit,
the second optical waveguide structure having a reflector at a first end and a waveguide body, the position of the reflector of the second optical waveguide structure corresponding to the light-detecting unit.

16. The optical coupler module according to claim 1 wherein the optical coupler module is a receiver module, and the signal conversion unit is a light-detecting unit including a photodiode or a photodetector for converting the optical signal into the corresponding electrical signal.

17. The optical coupler module according to claim 16 wherein the receiver module comprises an amplifier circuit disposed on the first film or a printed circuit board and electrically connected to the electrical transmission unit for amplifying and transmitting the corresponding electrical signal outputted from the light-detecting unit.

18. The optical coupler module according to claim 16 wherein the electrical transmission unit is formed on the first surface of the semiconductor, and the receiver module comprises an amplifier circuit disposed on and electrically connected to the electrical transmission unit for amplifying and transmitting the corresponding electrical signal outputted from the light-detecting unit.

19. The optical coupler module according to claim 18 wherein the driving circuit is implemented by a system on chip technology to integrate an integrated circuit with operation function into the amplifier circuit.

20. An optical coupler module for converting and transmitting an electrical signal or an optical signal, the optical coupler module comprising:
a semiconductor substrate having a first surface and a second surface opposite to the first surface;
a first film and a second film formed on the first surface and the second surface, respectively;
a control circuit with operation function formed on the first surface and adjacent to the first film;
at least one signal conversion unit mounted above the first film and electrically connected to the control circuit, for converting the electrical signal into a corresponding optical signal or converting the optical signal into a corresponding electrical signal; and
at least one optical waveguide structure formed on the second film and having a reflector at a first end and a waveguide body, the position of the reflector corresponding to the signal conversion unit, and the waveguide body of the first optical waveguide structure being made of silicon and having a V-shaped cross section along a lengthwise direction thereof, wherein the corresponding optical signal sequentially passes the first film, the semiconductor substrate and the second film and enters the optical waveguide structure so that the corresponding optical signal is reflected by the reflector and transmitted in the waveguide body to a second end of the optical waveguide structure; or the optical signal is transmitted in the waveguide body from the second end of the optical waveguide structure and reflected by the reflector, and the optical signal sequentially passes the second film, the semiconductor substrate and the first film to reach the signal conversion unit to be converted into the corresponding electrical signal.

* * * * *